United States Patent [19]

Imamura et al.

[11] Patent Number: 5,561,306

[45] Date of Patent: Oct. 1, 1996

[54] HETERO-BIPOLAR TRANSISTOR HAVING A PLURALITY OF EMITTERS

[75] Inventors: Kenichi Imamura; Motomu Takatsu; Toshihiko Mori, all of Kawasaki, Japan

[73] Assignee: Fujitsu Limited, Kawasaki, Japan

[21] Appl. No.: 295,538

[22] Filed: Aug. 25, 1994

[30] Foreign Application Priority Data

Dec. 27, 1993 [JP] Japan ................................ 5-329498

[51] Int. Cl.$^6$ ................ H01L 31/0328; H01L 31/0336; H01L 29/06
[52] U.S. Cl. .............. 257/197; 257/198; 257/25
[58] Field of Search ................................ 257/197, 198, 257/201, 25, 563, 564

[56] References Cited

U.S. PATENT DOCUMENTS

| 4,672,414 | 6/1987 | Gabriel et al. | 257/201 |
| 5,280,182 | 1/1994 | Waho | 257/197 |
| 5,329,144 | 7/1994 | Luryi | 257/197 |
| 5,389,804 | 2/1995 | Yokoyama et al. | 257/197 |
| 5,461,245 | 10/1995 | Gribnikov et al. | 257/197 |

FOREIGN PATENT DOCUMENTS 61-222166  10/1986  Japan ................................ 257/197

*Primary Examiner*—Wael M. Fahmy
*Attorney, Agent, or Firm*—Armstrong, Westerman, Hattori, McLeland & Naughton

[57] ABSTRACT

A hetero-bipolar transistor includes a collector layer of a first conductivity type, a base layer of a second conductivity type provided on the collector layer, a first emitter structure of the first conductivity type provided on the base layer, and a second emitter structure of the first conductivity type and provided on the base layer, wherein the first and second emitter structures are doped with respect to the base layer, with a sufficiently high impurity concentration level such that a Zener breakdown occurs at the p-n junction formed between the base layer and the first or second emitters upon application of a reverse bias voltage.

12 Claims, 16 Drawing Sheets

FIG. 6 PRIOR ART
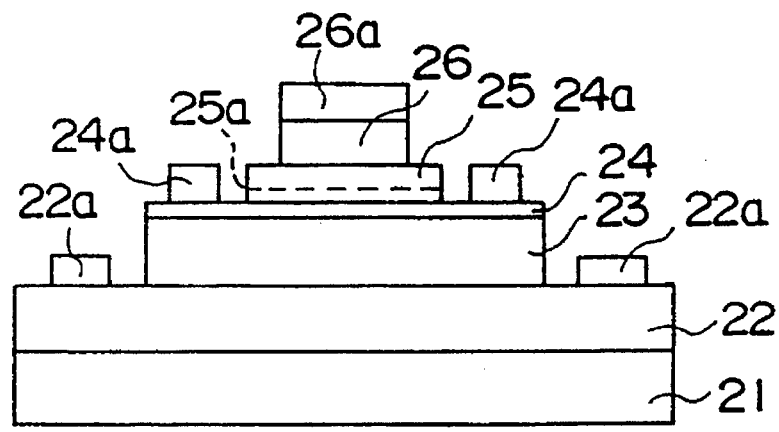
FIG. 7
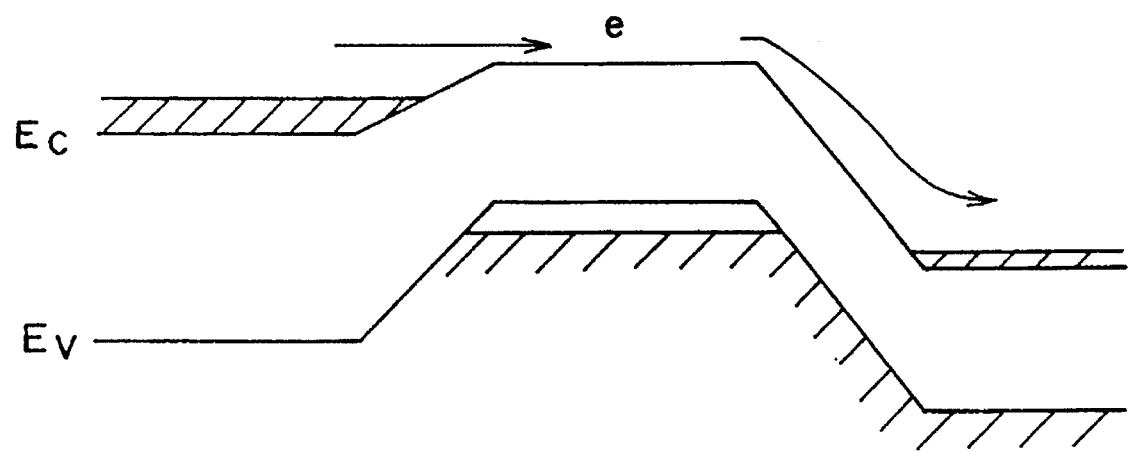
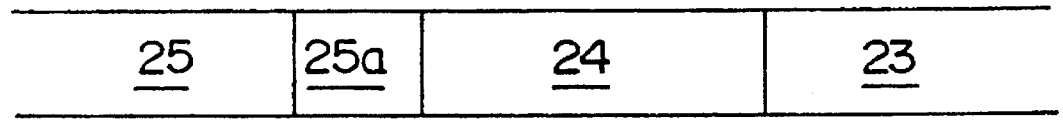

| 25b | 25a | 24 | 25a | 25b |

| 25b | 25a | 24 | 25a | 25b |

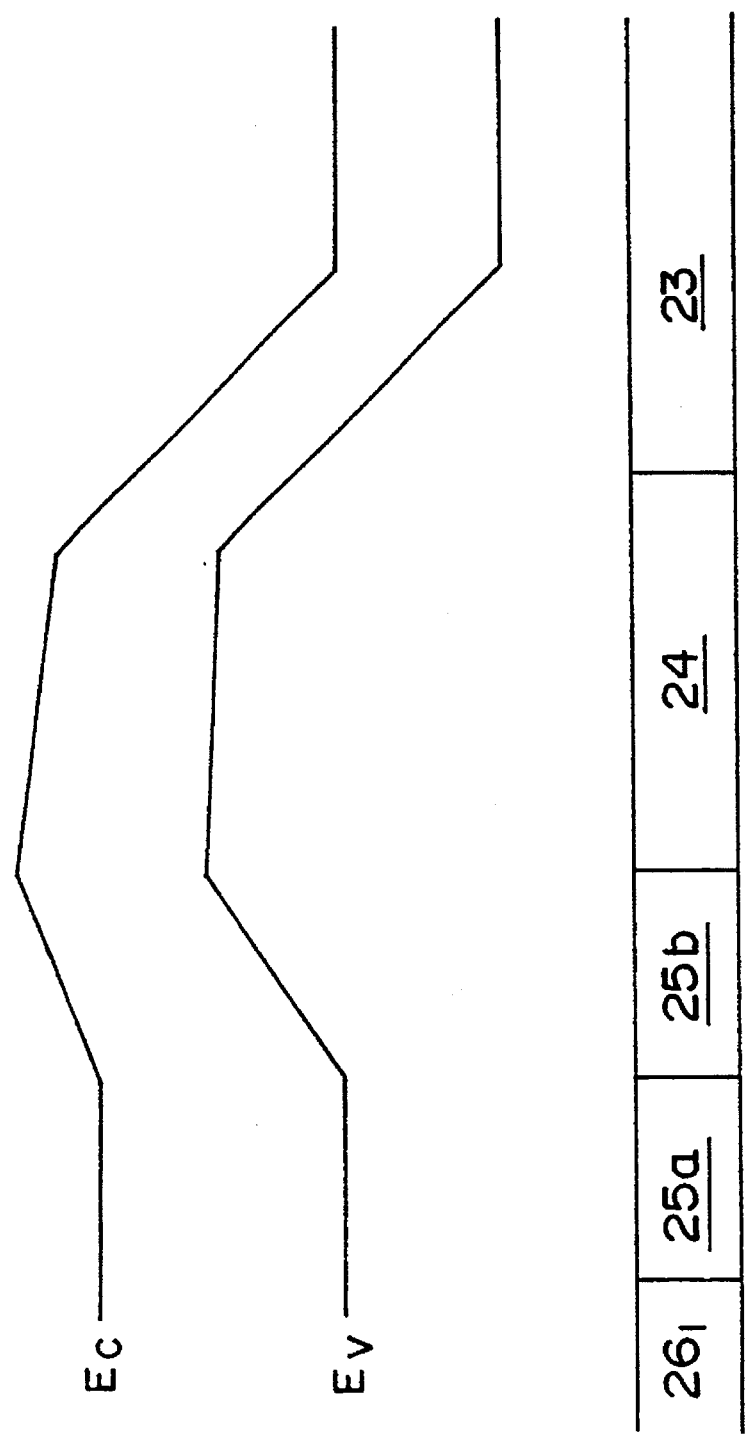

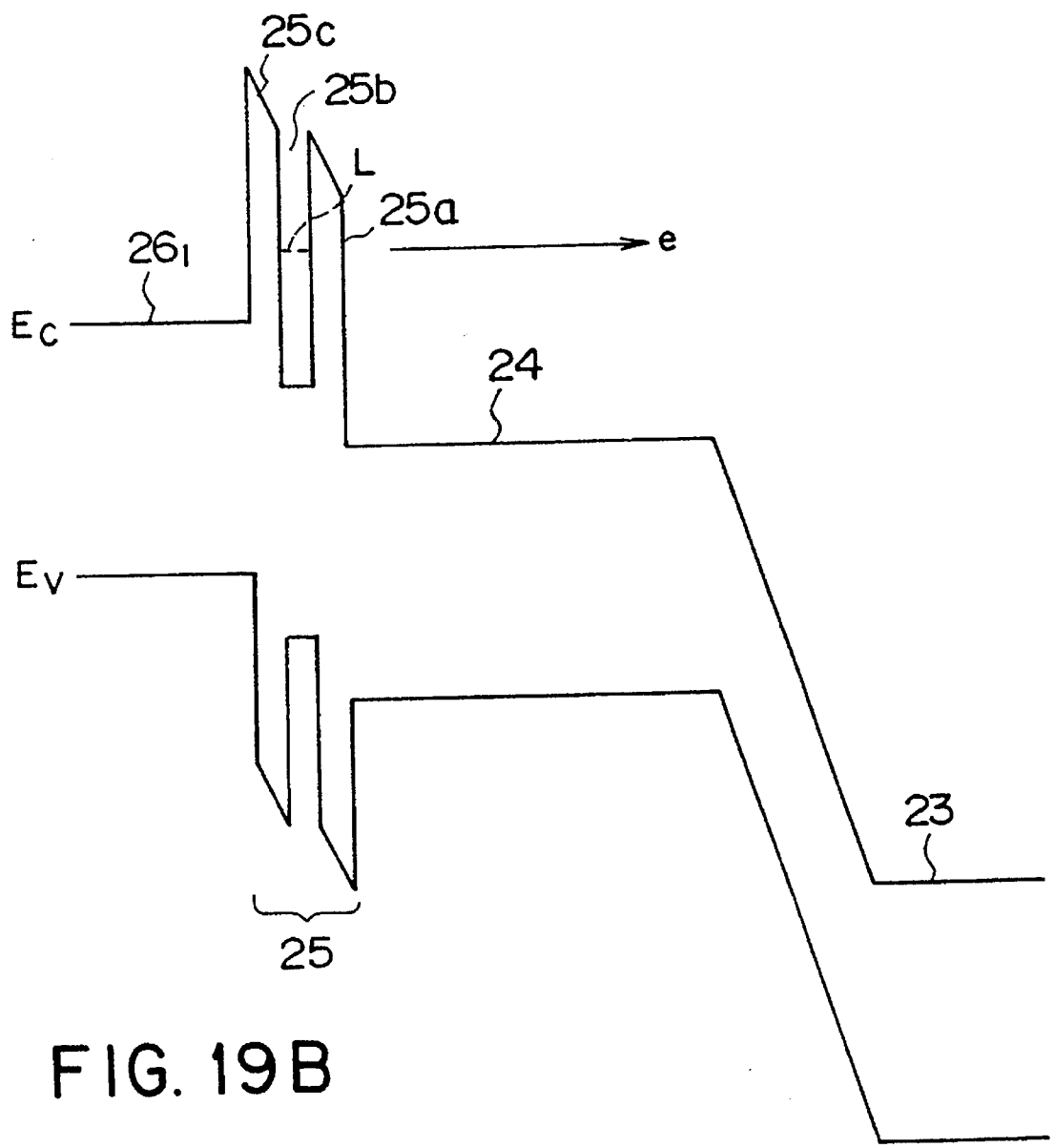

HETERO-BIPOLAR TRANSISTOR HAVING A PLURALITY OF EMITTERS

BACKGROUND OF THE INVENTION

The present invention generally relates to semiconductor devices and more particularly to a high speed bipolar transistor that uses a heterojunction of compound semiconductor materials.

Compound semiconductor materials such as GaAs or AlGaAs have a characteristic band structure that provides a large electron mobility. Thus, intensive efforts are being made on the research of semiconductor devices that use such compound semiconductor materials, in prospect of realizing high speed semiconductor devices. As the compound semiconductor materials generally form a mixed crystal over a wide compositional range, it is expected that such compound semiconductor devices provide the possibility of constructing various device structures tailored according to the specific needs. In this respect, compound semiconductor devices have distinct advantage over conventional semiconductor devices that are formed of single component semiconductor material such as Si or Ge. Thus, there are proposals to construct logic circuits or memory cells, conventionally formed of a large number of transistors, by means of single or small number of compound semiconductor devices.

FIG. 1 shows the construction of a conventional HET (hot electron transistor), which is a typical example of the compound semiconductor devices.

Referring to FIG. 1, the HET is constructed on a semi-insulating GaAs substrate 11 and includes a collector layer 12 of n-type GaAs formed on the substrate 11, a collector barrier layer 13 of undoped AlGaAs formed on the collector layer 12, and a base layer 14 of n-type GaAs formed on the collector barrier layer 13. On the base layer 14, an emitter barrier layer 15 of undoped AlGaAs is formed, and an emitter layer 16 of n-type GaAs is formed further on the emitter barrier layer 15. A part of the collector layer 12 is exposed and a collector electrode 12a is formed in correspondence to such an exposed part. Similarly, a part of the base layer 14 is exposed and a base electrode 14a is formed in correspondence to such an exposed part. Furthermore, an emitter electrode 16a is formed on the emitter layer 16.

FIG. 2 shows the band structure of the HET of FIG. 1 for the state in which a bias voltage is applied between the emitter electrode 16a and the collector electrode 12a.

Referring to FIG. 2, the electrons on the conduction band Ec of the emitter layer 16 cause a transit through the emitter barrier layer 15 by tunneling and are injected to the base layer 14 in the form of hot electrons. The hot electrons thus injected have energies much higher than the energy level of the band edge of the base layer 14, and are injected to the collector layer 12 by overriding the potential barrier formed in the conduction band of the collector barrier layer 13 with a barrier height $\Delta E_c$. On the other hand, the normal, cold electrons on the conduction band Ec of the base layer 14 are prevented from flowing to the collector layer 12 by the potential barrier $\Delta E_c$ of the collector barrier layer 13. In such a structure, one can control the probability of tunneling of the electrons to pass through the emitter barrier layer 15 by the base voltage applied to the base electrode 14a. As a result of the control of the tunneling probability thus achieved, the collector current is controlled as a function of the base voltage.

In order to secure a large current gain in such conventional HETs, it is necessary to reduce the thickness of the base layer 14 as much as possible, such that the hot electrons do not lose energy in the base layer 14 as a result of scattering. When the hot electrons lose energy in the base layer 14, the chance that the electrons and holes cause recombination in the base layer 14 increases, while such a recombination of the carriers invites unwanted increase of the base current. In relation to the scattering of the carriers in the base layer 14, there arises another problem, in such a HBT, in that one cannot increase the concentration level of the impurities in the base layer 14 as desired, in view of the requirement for minimizing the impurity scattering of the carriers in the base layer 14. Thus, it will be easily understood that the fabrication of such a HET having the base layer 14 with extremely small thickness and low impurity concentration level, is extremely difficult. This difficulty becomes particularly conspicuous when a large number of HETs are assembled to form an integrated circuit.

Further, such a conventional HET operates satisfactorily only in the extremely low temperature environment where the thermal excitation of the electrons in the base layer 14 is small. When the environmental temperature increases, the electrons thermally excited in the base layer 14 tend to override the collector barrier $\Delta E_c$ and flows into the collector layer 12.

In order to avoid such uncontrolled injection of the carriers, one may motivated to increase the barrier height $\Delta E_c$. However, use of such a large barrier height $\Delta E_c$ necessitates a large emitter-collector voltage for the operation of the device. When a large emitter-collector voltage is used, the electrons tend to cause inter-band transition and the control of the transistor operation by way of the base voltage becomes impossible. From the foregoing reasons, it is believed that the practical operational temperature of HETs is limited below 77 K.

FIG. 3 shows the construction of another HET proposed by the inventors of the present invention. In FIG. 3, those parts corresponding to the structure of FIG. 1 are designated by the same reference numerals and the description thereof will be omitted.

Referring to FIG. 3, the illustrated HET includes a first emitter layer $16_1$ of n-type GaAs and a second emitter layer $16_2$ also of n-type GaAs, wherein both of the first and second emitter layers $16_1$ and $16_2$ are formed on the common emitter barrier layer 15 with a mutual separation from each other, while it will be noted that the structure of FIG. 3 lacks the base electrode 14a. Further, first and second emitter electrodes $16a_1$ and $16a_2$ are formed respectively on the emitter layers $16_1$ and $16_2$.

In the transistor that lacks the base electrode as such, the electrons captured by the base layer upon injection of the electrons via one of the emitters, are removed from the base layer via the other of the emitters. Hereinafter, the operation of the HET of FIG. 3 will be described with reference to the band structure of FIG. 4.

Referring to FIG. 4, the majority of the hot electrons injected to the base layer 14 from the emitter layer 161 via the emitter barrier layer 15, reach the collector layer 12 after overriding the collector barrier layer 13 similarly to the case of FIG. 2. On the other hand, a part of the hot electrons may be scattered in the base layer 14 and captured by the base layer 14 as a result of recombination with the holes existing in the base layer 14. In the device of FIG. 3, the electrons thus accumulated in the base layer 14 are then removed therefrom via the emitter barrier layer 15 by applying a positive voltage to the second emitter electrode $16_2$ (with respect to the electrode $16_1$). Thereby, a current corresponding to the base current of the HET of FIG. 1 flows through the emitter $16_2$ as well as through the emitter electrode $16a_2$, and the transistor operates similarly to the ordinary HET. As will be easily noted from the structure of FIG. 3, such a HET of multiple emitter construction lacks the base electrode provided directly on the thin base layer and is easily fabricated, particularly in the form of integrated circuit.

Further, it should be noted that the single HET of FIG. 3 operates also as a logic circuit, which has conventionally been constructed from a number of devices, by changing the combination of the input voltages applied to the emitter electrodes $16a_1$ and $16a_2$ as will be described below.

FIG. 5 shows the equivalent circuit diagram corresponding to the transistor of FIG. 3, wherein the transistor of FIG. 5 is different from the transistor of FIG. 3 in that there are four emitter electrodes instead of the aforementioned two emitter electrodes $16a_1$ and $16a_2$.

Referring to FIG. 5, logic signals A–D are applied to the four emitter electrodes respectively, wherein the HET, having a symmetrical structure with respect to the plurality of emitters and emitter electrodes, operates symmetrically with respect to the input signals A–D and forms an exclusive NOR (XNOR) circuit. In other words, the single HET of FIG. 3 constructs a logic circuit that has hitherto been constructed from a plurality of transistors.

While the HET of FIG. 3 has such an advantageous feature of constructing complex logic circuits from small number of devices, the HET does have a problem in that the operation of the device in a high temperature environment exceeding the temperature of 77 K., such as the room temperature, inevitably causes an uncontrolled injection of thermally excited electrons from the base layer 14 to the collector layer 12. It is believed that this problem of room temperature operation is inherent to the principle of HET that distinguishes the hot electrons and the cold electrons by means of the collector barrier. In order to construct a device that is operational in the room temperature environment, one has to rely upon a transistor operating based upon a different principle.

FIG. 6 shows the construction of a HBT (heterojunction bipolar transistor), which is similar to the construction of a HET.

Referring to FIG. 6, the HBT is constructed upon a substrate 21 of semi-insulating GaAs and includes a collector contact layer 22 of n-type GaAs formed on the substrate 21 and a collector layer 23 of n-type GaAs formed on the collector contact layer 22. Further, a base layer 24 of p-type GaAs is formed on the collector layer 23, and an emitter layer 25 of n-type material having a large bandgap such as AlGaAs is formed on the base layer 24. Further, an emitter contact layer 26 of n-type GaAs is formed on the emitter layer 25. Furthermore, there is provided a graded layer $25a$ on the part of the emitter layer 25 that contacts with the base layer 24, such that the concentration level of Al increases with increasing distance from the base layer 24. The surface of the contact layer 22 is exposed partially, and a contact electrode $22a$ is provided in correspondence to such an exposed part. Similarly, the surface of the base layer 22 is exposed partially, and a base electrode $24a$ is provided in correspondence to the exposed part. Further, an emitter electrode $26a$ is formed on the emitter contact layer 26.

FIG. 7 shows the band structure for explaining the operation of the conventional HBT, wherein the conduction band and the valence band are designated respectively by Ec and Ev.

Referring to FIG. 7, the electrons in the emitter layer 25 are injected to the base layer 24 through the graded layer $25a$ at the emitter-base interface. The electrons thus injected transit through the base layer 24 by drifting and reach the collector layer 23. The HBT of such a construction is characterized by a small base current due to the large bandgap of the emitter layer 25 as compared with the base layer 24, and achieves a large current gain as a result. Further, because of the large electron mobility of GaAs that forms the base layer 24, the HBT operates at a high speed. Furthermore, it should be noted that the base layer 24 and the collector layer 23 of the HBT are separated electrically from each other by means of a depletion region associated with the p-n junction, not by the barrier layer as in the case of HET. Thus, the HBT operates stably even in the room temperature environment.

However, the HBT of FIG. 6, having the base electrode $24a$ provided on the extremely thin base layer 24, has a problem similar to the HET of FIG. 1 in that the fabrication of the device is difficult. Further, the p-n junction, formed between the base layer 24 and the emitter layer 25, is exposed on the base layer 24 in the HBT of FIG. 6, while such an exposure of the emitter-base junction invites instability of operation of the device due to the surface states formed in correspondence to such a base-emitter junction by contamination.

In such a situation, a person skilled in the art would be motivated to eliminate the base electrode and provide, instead of the base electrode, a plurality of emitters and corresponding emitter electrodes on the HBT similarly to the HET of FIG. 3. Hereinafter, the problems that are encountered in such a multiple emitter HBT construction will be examined in detail.

First, the structure of a HBT shown in FIG. 8 will be described, wherein those parts described previously are designated by the same reference numerals and the description thereof will be omitted.

Referring to FIG. 8, the illustrated HBT includes a first emitter contact layer $26_1$ of n-type GaAs formed on the emitter layer 25 and a second emitter contact layer $26_1$ also of n-type GaAs provided on the same emitter layer 25 with a separation from the foregoing emitter contact layer $26_1$, wherein the emitter contact layer $26_1$ carries thereon a first emitter electrode $26a_1$ while the emitter contact layer $26_2$ carries thereon a second emitter electrode $26a_2$. When a typical HBT structure, shown in FIG. 6, is used for the device of FIG. 8, the collector layer 23 is formed of an n-type GaAs layer having a thickness of about 300 nm and an impurity concentration level of $1\times10^{17}$ cm$^{-3}$ while the base layer 24 is formed of a p-type GaAs layer having a thickness of about 100 nm and an impurity concentration level of $5\times10^{18}$ cm$^{-3}$. Further, the emitter layer 25 may be formed of an n-type AlGaAs layer having a thickness of about 200 nm and an impurity concentration level of $3\times10^{17}$ cm$^{-3}$. It should be noted that a part of the emitter layer 25 that contacts with the base layer 24 is formed of a graded layer $25a$ having a thickness of about 20 nm and a composition represented by $Al_xGa_{1-x}As$, wherein the compositional parameter x changes generally linearly in the graded layer $25a$ from the upper major surface of the base layer to the upper boundary to the emitter layer 25. It should be noted that the compositional parameter x reaches a value of about 0.30 at the upper boundary of the graded layer 0.30. By providing such a graded layer between the base layer 24 and the emitter layer 25, it is possible to eliminate the discontinuous change or kink of the conduction band and the valence band at the heterojunction interface.

FIG. 9 shows a band diagram for explaining the operation of the HBT of FIG. 8. In FIG. 9, it should be noted that the conduction band is designated as Ec while the valence band is designated as Ev.

Referring to FIG. 9, the electrons are injected from one of the emitter electrodes and a corresponding emitter contact layer, such as the emitter electrode $26a_1$ and the emitter contact layer $26_1$, to the emitter layer 25 that includes the graded layer 25a therein, wherein the electrons thus injected to the emitter layer 25 are further injected to the base layer 24 and reach the collector layer 23 after crossing the base layer 24 under a suitable bias condition, similarly to ordinary bipolar transistors. Thereby, a part of the electrons injected to the base layer 24 cause a recombination with holes in the base layer 24, and as a result, there occurs a depletion of holes and corresponding excess of electrons in the base layer 24. In the conventional bipolar transistor shown in FIG. 6, such excess electrons are removed from the base layer 24 via the base electrode 24a in the form of the base current.

As the HBT of FIG. 8 does not use the base electrode 24a, such a removal of the electrons from the base electrode by way of the base electrode is not possible. On the other hand, it may be possible to remove the excess electrons from the base layer 24 by using the emitter electrode $26a_2$ and corresponding emitter contact layer $26_2$ as a base.

FIG. 9 shows the band diagram for explaining such an operation of the HBT. It should be noted that FIG. 9 shows the band structure taken along a line connecting the emitter contact layer $26_1$, the emitter layer 25, the graded layer 25a, the base layer 24, the graded layer 25a, the emitter layer 25 and the emitter contact layer $26_2$.

Referring to FIG. 9, there is formed a depletion layer at the junction interface between the n-type emitter layer 25 (the graded layer 25a included) and the p-type base layer 24 as is well known in the art, wherein the electrons are easily injected from an emitter region $E_1$, corresponding to the emitter electrode $26a_2$ and the emitter contact layer $26_2$, to the base layer 24 through the depletion layer, in the forward biasing state of the emitter region $E_1$. On the other hand, a region $E_2$ of the emitter 25 corresponding to the emitter electrode $26a_2$ and the emitter contact layer $26_2$, is applied with a reverse biasing, and because of this, the depletion layer formed between the emitter region $E_2$ and the base layer 24 has a substantial thickness. Thus, the transit of the electrons through such a depletion layer is difficult. In other words, it is difficult to remove the electrons from the base layer in the HBT having the structure of FIG. 8, even when one uses the emitter contact layer $26_2$ and the emitter electrode $26a_2$ in place of the base of ordinary HBT.

SUMMARY OF THE INVENTION

Accordingly, it is a general object of the present invention to provide a novel and useful bipolar transistor and a logic device using such a bipolar transistor wherein the foregoing problems are eliminated.

Another and more specific object of the present invention to provide a bipolar transistor easy for fabrication and a logic device that uses such a bipolar transistor.

Another object of the present invention is to provide a bipolar transistor and a logic device that uses such a bipolar transistor, wherein there are formed first and second, mutually separated emitter regions on a common base layer to form respective p-n junctions, wherein the thickness of depletion region associated with the foregoing p-n junction is set to allow a tunneling of electrons through the depletion region.

Another object of the present invention is to provide a bipolar transistor comprising:

a collector layer of a semiconductor material having a first conductivity type;

a collector electrode provided on said collector layer for collecting carriers from said collector layer;

a base layer of a semiconductor material having a second, opposite conductivity type and provided on said collector layer;

a first emitter provided on said base layer with said first conductivity type in correspondence to a first region defined on said base layer, for injecting carriers into said first region of said base layer;

a first emitter electrode provided on said first emitter for supplying carriers to said first emitter;

a second emitter provided on said base layer with said first conductivity type in correspondence to a second region defined on said base layer with a separation from said first region, for injecting carriers into said second region of said base layer; and a second emitter electrode provided on said second emitter for supplying carriers to said second emitter;

at least said second emitter and said base layer being doped to respective impurity concentration levels set such that carriers in said base layer can escape to said second emitter by way of tunneling through a depletion region formed between said base layer and said second emitter. According to the present invention, the electrons accumulated in the base layer as a result of recombination of holes in the base layer with electrons injected from the first emitter, are removed efficiently by way of tunneling through the depletion region formed between the base layer and the second emitter, to the second emitter. In other words, the second emitter acts similarly to the base in the conventional HBT. The bipolar transistor having such a construction does not use a base electrode, and the problem associated with the process for providing a base electrode on an extremely thin base layer is successfully eliminated.

In a preferred embodiment of the present invention, said second emitter is doped to a concentration level such that a carrier density exceeding an effective state density is realized therein, and wherein said base layer is doped to a concentration level such that a carrier density equal to or exceeding an effective state density is realized in said base layer.

In a more preferred embodiment of the present invention, said second emitter and said base layer are doped with respective impurity concentration levels set such that said depletion region has a thickness of 10 nm or less. According to the features of the present invention as set forth above with respect to preferred embodiments, one can decrease the thickness of the depletion region by doping the base layer and the second emitter to respective, sufficiently high impurity concentration levels. The p-n junction formed by the semiconductor layers having such high impurity concentration levels easily cause Zener breakdown when a reverse biasing is applied, and the electrons in the base layer escape to the second emitter layer by way of tunneling through the depletion layer. As a result, the accumulation of electrons in the base layer is eliminated and the transistor operates stably.

In another preferred embodiment of the present invention, said first emitter includes an emitter layer covering the entirely of an upper major surface of said base layer and a first emitter contact layer formed on said emitter layer in correspondence to said first region of said base layer, and wherein said second emitter layer includes said emitter layer and a second emitter contact layer formed on said emitter layer in correspondence to said second region of said base layer. According to the present invention, the problem of the p-n junction being exposed in the conventional HBT structure is successfully eliminated by covering the entire upper major surface of the base layer by the emitter layer. Thereby, the problem of instable operation of the HBT due to the surface states formed by the contamination of the exposed p-n junction is successfully eliminated.

In a preferred embodiment of the present invention, said semiconductor material forming said emitter layer is doped to said first conductivity type and has a bandgap substantially exceeding a bandgap of said semiconductor material forming said base layer. According to the present invention, one can reduce the injection of holes to the emitter layer from the collector layer as a result of use of the wide gap material for the collector layer, and the current gain of the bipolar transistor increases substantially.

In a preferred embodiment of the present invention, said emitter layer has a thickness that allows a tunneling of electrons therethrough. According to the present invention, the emitter layer acts as a tunneling barrier that selectively injects electrons having high energy to the base layer in the form of hot electrons while withholding the injection of low energy, cold electrons. It should be noted that such hot electrons reach the collector layer after crossing the base layer with high efficiency, and the proportion of the electrons that are accumulated in the base layer as a result of recombination with the holes is reduced substantially. In other words, the bipolar transistor having such a construction provides a high current gain.

In a preferred embodiment of the present invention, said semiconductor layer forming said emitter layer is undoped and has a bandgap exceeding a bandgap of said semiconductor material that forms said base layer, said emitter layer having a thickness set so as to allow a tunneling of electrons therethrough.

In a more preferred embodiment of the present invention, said emitter layer includes first and second barrier layers forming a resonant-tunneling barrier and a quantum well layer sandwiched between said first and second barrier layers, said quantum well layer including therein quantum levels. According to the present invention, one can achieve an efficient injection of hot electrons from the emitter layer to the base layer by way of the resonant-tunneling barrier formed in the emitter layer. Thereby, the current gain of the device is improved substantially.

In a preferred embodiment of the present invention, said base layer has a compositional gradient and a corresponding gradient in a conduction band and a valence band, such that a potential of said conduction band and said valence band decreases gradually from a first surface of said base layer where said base layer contacts with said emitter layer to a second surface of said base layer where said base layer contacts with said collector layer.

In a more preferred embodiment of the present invention, said base layer has a thickness generally equal to a mean free path of carriers in said base layer. According to the present invention, the electrons injected to the base layer from the emitter layer are accelerated by the electric field in the base layer and reaches the collector layer with high efficiency. Thereby, the current gain of the transistor is improved substantially.

In a preferred embodiment of the present invention, said first emitter includes an emitter layer formed on an upper major surface of said base layer and a first emitter electrode formed on said emitter layer in correspondence to said first region of said base layer, said second emitter includes said emitter layer and a second emitter electrode formed on said emitter layer in correspondence to said second region of said base layer, wherein said emitter layer carries first and second alloy regions forming a shallow ohmic contact respectively with said first and second emitter electrodes. According to the present invention, one can reduce the base resistance by forming the alloy regions in the emitter layer in correspondence to said first and second emitter electrodes.

Another object of the present invention is to provide a bipolar transistor, comprising:

a collector layer of a semiconductor material having a first conductivity type;

a collector electrode provided on said collector layer for collecting carriers from said collector layer;

a base layer of a semiconductor material having a second conductivity type and provided on said collector layer;

a plurality of emitters having said first conductivity type and each provided on said base layer for injecting carriers into corresponding regions of said base layer; and a plurality of emitter electrodes provided in correspondence to said plurality of emitters for supplying carriers to said corresponding emitters;

wherein each of said emitter electrodes and said base layer are doped to respective impurity concentration levels set such that carriers in said base layer can escape to said plurality of emitters by way of tunneling through a depletion layer formed between said base layer and each of said emitters. According to the present invention, the electrons accumulated in the base layer as a result of recombination of holes in the base layer with electrons injected from one of the emitters, are removed efficiently by way of tunneling through the depletion region formed between the base layer and the second emitter to the other one of the emitters. In other words, the plurality of emitters act similarly to the base in the conventional HBT. The bipolar transistor having such a construction does not use a base electrode, and the problem associated with the process for providing a base electrode on an extremely thin base layer is successfully eliminated.

Another object of the present invention is to provide a logic circuit, comprising:

a bipolar transistor comprising:

a collector layer of a semiconductor material having a first conductivity type;

a collector electrode provided on said collector layer for collecting carriers from said collector layer;

a base layer of a semiconductor material having a second conductivity type and provided on said collector layer;

a plurality of emitters having said first conductivity type and each provided on said base layer for injecting carriers into corresponding regions of said base layer; and a plurality of emitter electrodes provided in correspondence to said plurality of emitters for supplying carriers to said corresponding emitters;

wherein each of said emitter electrodes and said base layer are doped to respective impurity concentration levels set such that carriers in said base layer can escape to said plurality of emitters by way of tunneling through a depletion layer formed between said base layer and each of said emitters;

a power terminal connected electrically to said collector electrode;

an output terminal connected electrically to said collector electrode; and a plurality of input terminals each connected electrically to corresponding one of said plurality of emitter electrodes. According to the present invention, it is possible to construct an XNOR circuit by a single transistor. As the logic circuit is formed of single transistor, one can construct a logic integrated circuit having a very large integration density.

Other objects and further features of the present invention will become apparent from the following detailed description when read in conjunction with the attached drawings.

BRIEF DESCRIPTION OF THE DRAWINGS

FIG. 6 is a diagram showing the structure of a conventional HBT;

FIG. 7 is a band diagram for explaining the operation of the HBT of FIG. 6;

FIG. 10 is a band diagram for explaining the operation of.

FIG. 16 is a band diagram showing the construction of the HBT according to a second embodiment of the present invention;

FIG. 19 is a band diagram for explaining the operation of the HBT of FIG. 18;

DETAILED DESCRIPTION OF PREFERRED EMBODIMENTS

Figure 11:
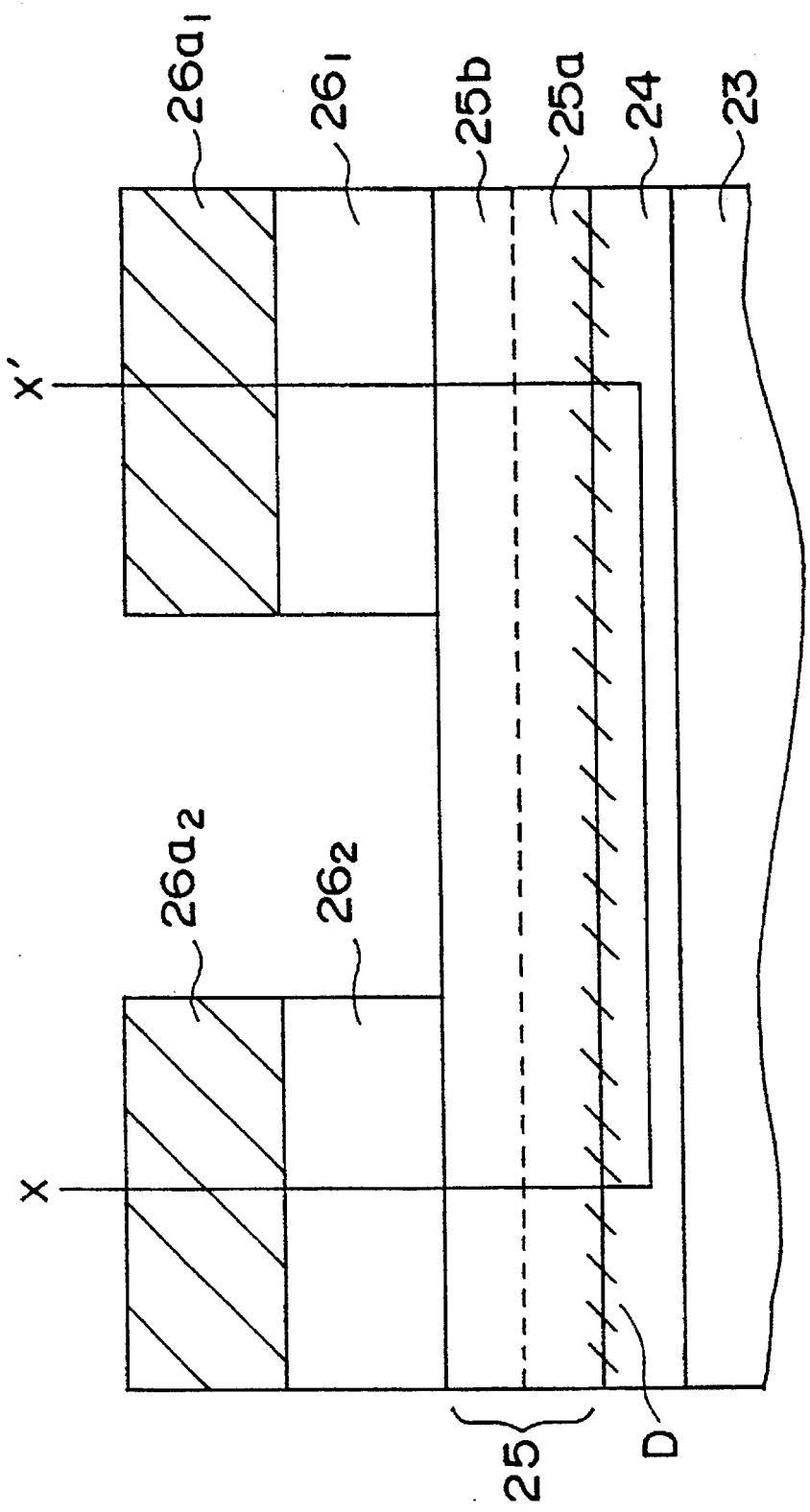
FIG. 11 is a cross sectional diagram showing the essential part of the HBT of FIG. 8 in an enlarged scale.

Hereinafter, a HBT according to a first embodiment will be described with reference to FIGS. 8 and 11, wherein FIG. 11 shows the essential part of the HBT of FIG. 8 in an enlarged scale.

Referring to FIG. 11, the base layer 24 is formed of p-type GaAs having a thickness of about 100 nm, while the emitter layer 25 is formed of n-type AlGaAs having a thickness of about 200 nm. The emitter layer 25 includes a graded layer 25a in correspondence to the part that forms a junction between the emitter layer 25 and the base layer 24, with a thickness of about 20 nm, wherein the graded layer 25a has a compositional profile such that the content of Al increases generally linearly with increasing distance from the interface between the layer 25a and the base layer 24.

On the graded layer 25a, there is provided a AlGaAs layer 25b that forms another part of the emitter layer 25, wherein the layer 25b has a generally homogeneous, uniform composition represented as $Al_{0.3}Ga_{0.7}As$. Further, it should be noted that the first and second emitter contact layers $26_1$ and $26_2$ have substantially the same thickness and occupy substantially the same area. In other words, the HBT of FIG. 11 is constructed symmetrically with respect to the contact layer $26_1$ and the contact layer $26_2$, as well as with respect to the first region of the emitter layer 25 corresponding to the contact layer $26_1$ and the second region of the emitter layer 25 corresponding to the contact layer $26_2$.

In the structure of FIG. 11, the base layer 24, formed of GaAs as already noted, is doped by a p-type dopant such as Be to a high impurity concentration level exceeding the level of $8.14 \times 10^{18}$ $cm^{-3}$ which corresponds to the effective density of states of the holes on the valence band of the GaAs crystal. In correspondence to this, the emitter layer 25 of AlGaAs is doped, by an n-type dopant such as Si, to a high impurity concentration level exceeding a level of $6.98 \times 10^{17}$ $cm^{-3}$ which corresponds to the effective density of states of the electrons on the conduction band of the AlGaAs crystal. When the semiconductor layers 24 and 25 forming a p-n junction therebetween are doped to such a high impurity concentration level, it should be noted that the thickness of the depletion layer D, represented in FIG. 11 by hatching, decreases to a thickness below 10 nm, and the electrons in the base layer 24 can escape to the emitter layer 25 by way of tunneling through the depletion layer D when a reverse bias voltage is applied across the base layer 24 and the emitter layer 25. In such a state, there occurs a Zener breakdown in the foregoing p-n junction.

Figure 10:
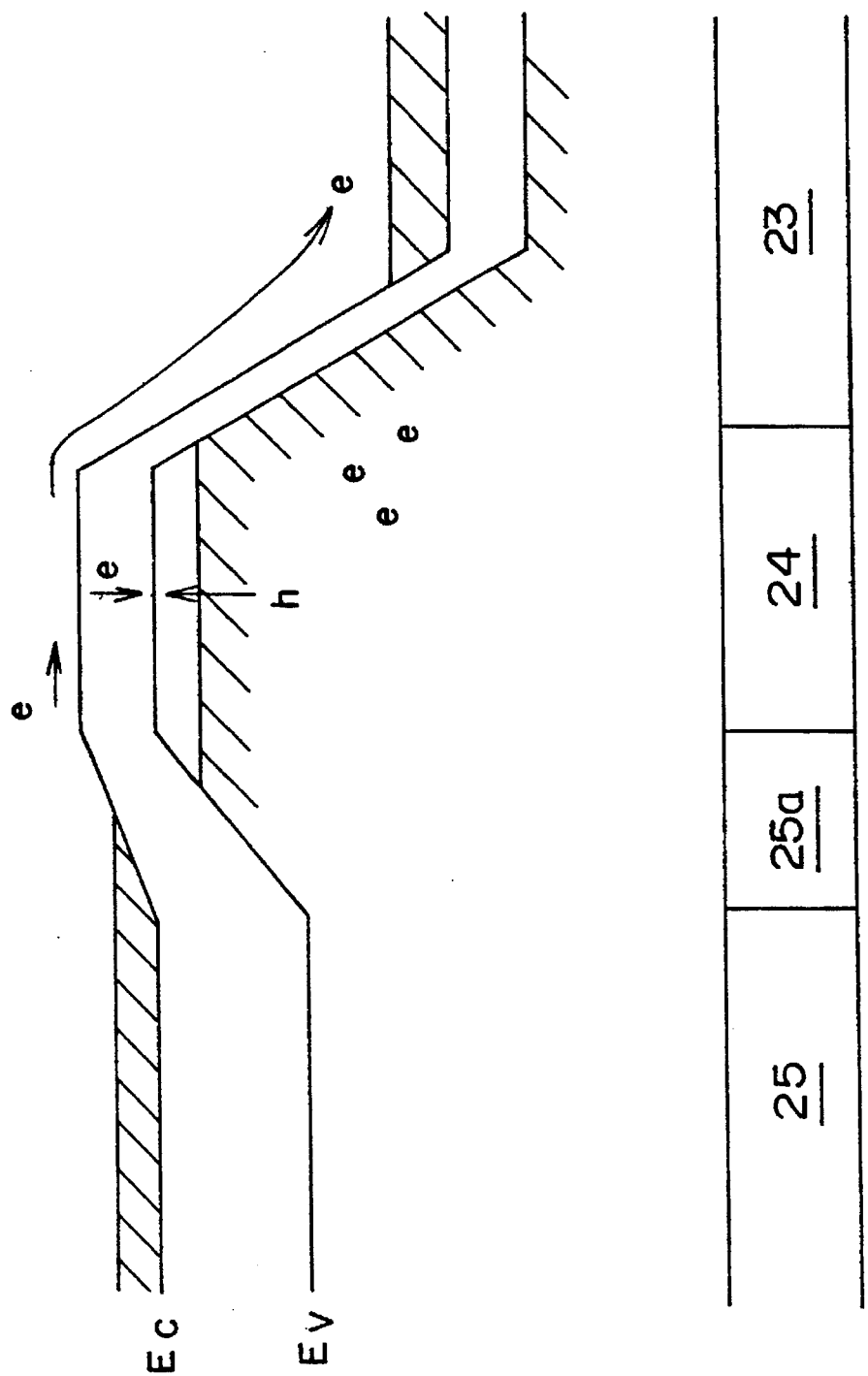
Figure 12:
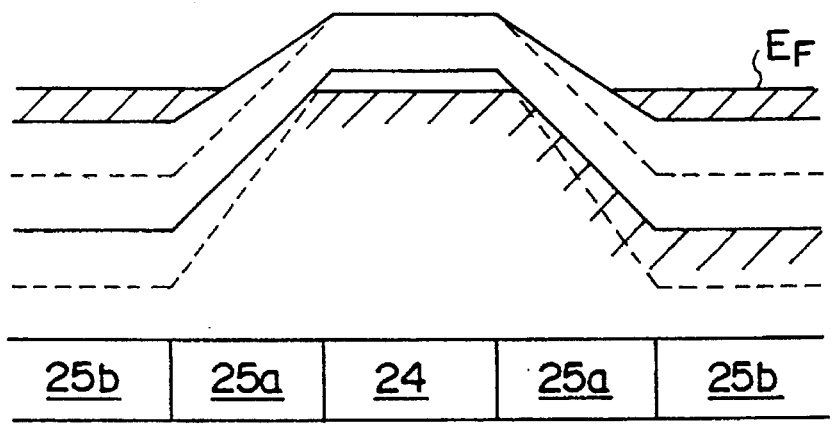
FIG. 12 is a said diagram showing the construction for eliminating the problem explained in FIG. 9.

FIG. 12 shows the band structure of the HBT of FIG. 10 in the thermal equilibrium state, along a path X–X' in FIG. 11, wherein the conduction band and the valence band are represented respectively as Ec and Ev in FIG. 12, similarly as before.

Figure 1:
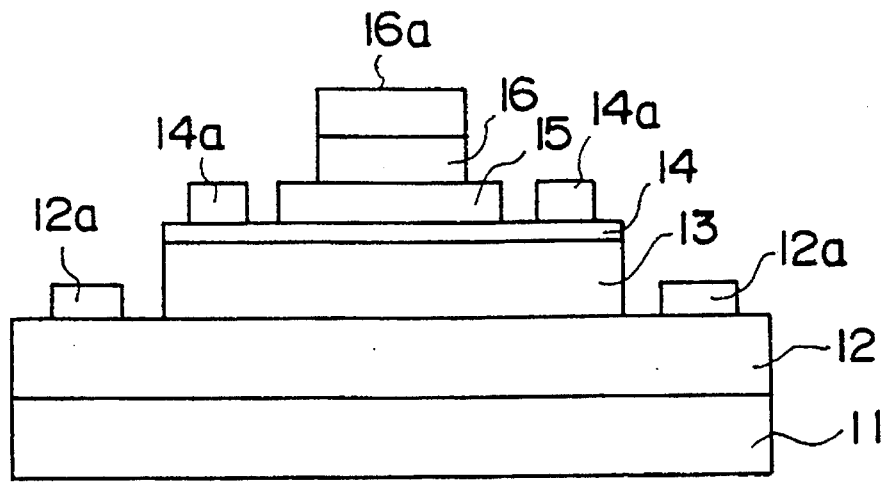
FIG. 1 is a cross sectional diagram showing the construction of a conventional HET.
Figure 2:
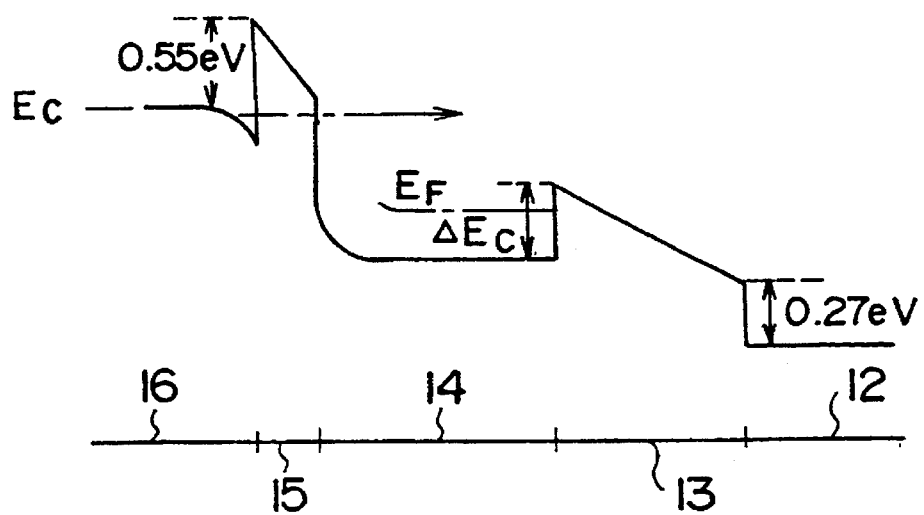
FIG. 2 is a band diagram of the HET of FIG. 1.
Figure 3:
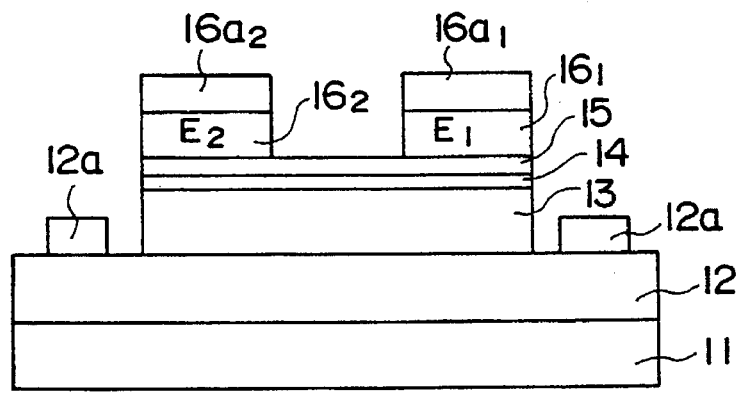
FIG. 3 is a cross sectional diagram showing the construction of an according to the present invention
Figure 4:
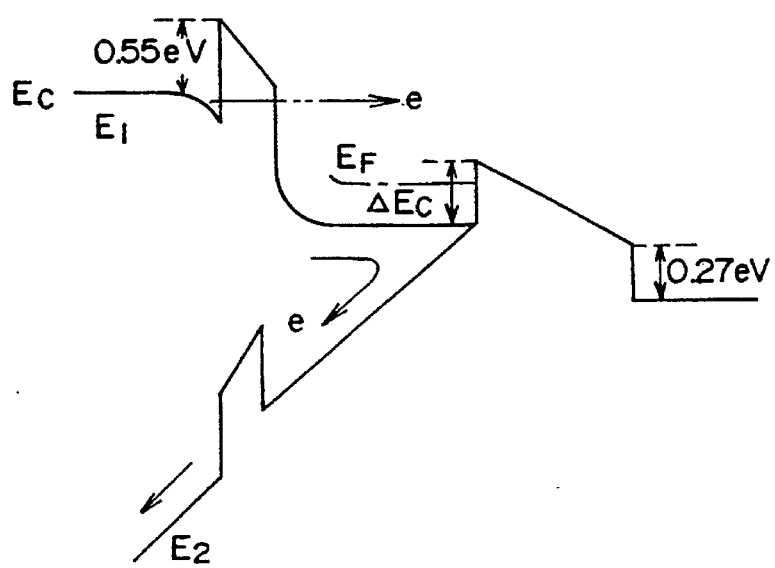
FIG. 4 is a band diagram for explaining the operation of the HET of FIG. 3.
Figure 5:
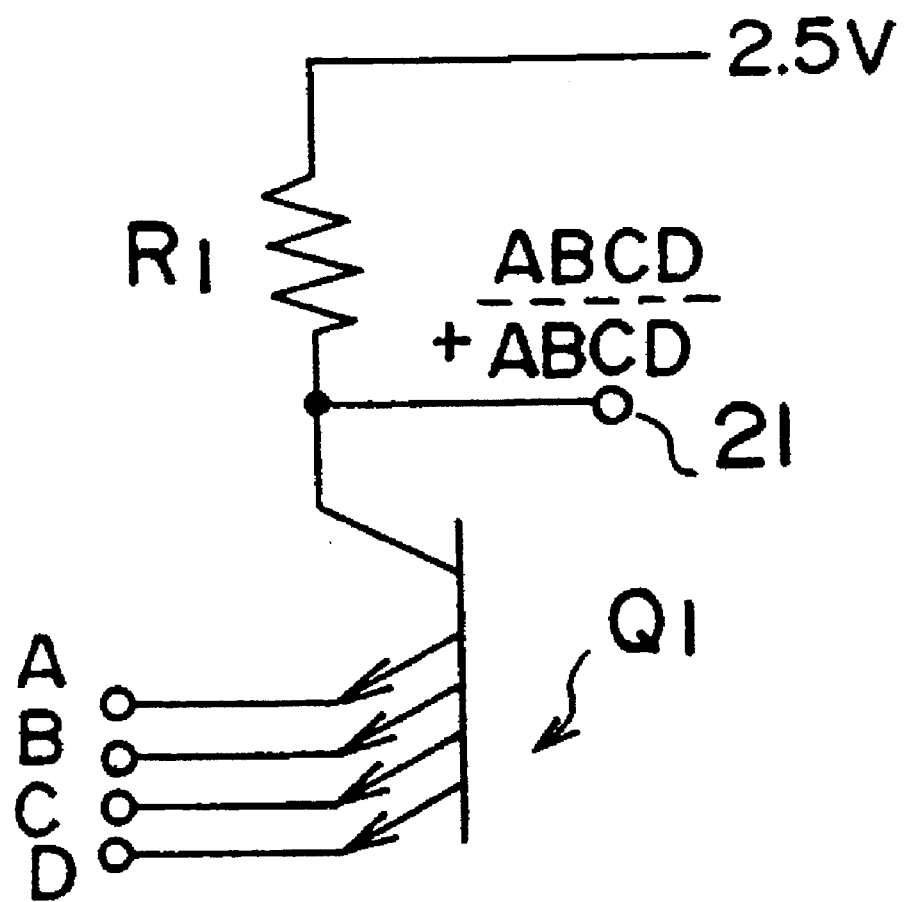
FIG. 5 is a circuit diagram showing a logic circuit formed of the HET of FIG. 3.
Figure 8:
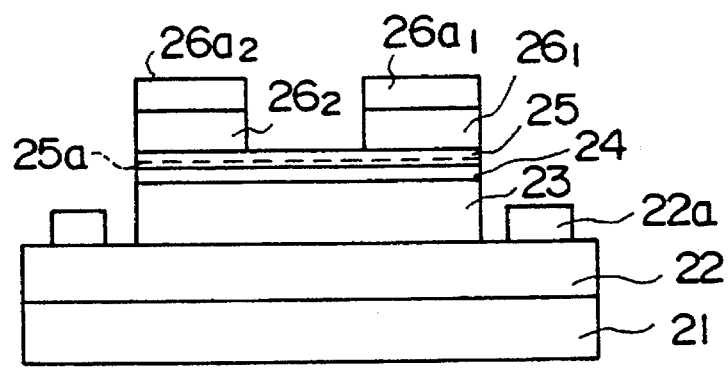
FIG. 8 is a diagram showing the construction of a HBT according to a first embodiment of the present invention in a cross sectional view.
Figure 9:
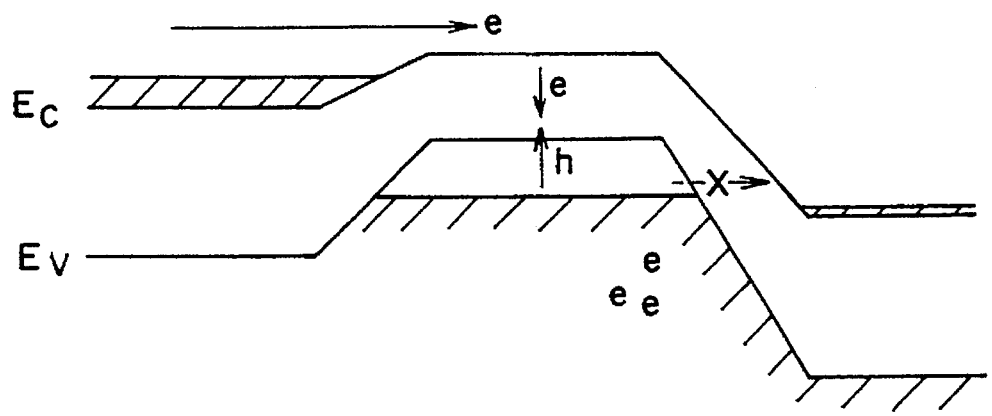
FIG. 9 is a band diagram for explaining the problem encountered in the HBT of FIG. 8.

Referring to FIG. 12, the continuous line corresponds to the structure of FIG. 8, where the base layer 24 and the emitter layer 25 have respective, ordinary impurity concentration levels of $5 \times 10^{18}$ $cm^{-3}$ and $3 \times 10^{17}$ $cm^{-3}$. On the other hand, the broken line corresponds to the HBT of FIG. 11 where the base layer 24 is doped to the impurity concentration level of more than $8.14 \times 10^{18}$ $cm^{-3}$ and the emitter layer 25 is doped to the impurity concentration level of more than $6.98 \times 10^{17}$ $cm^{-3}$.

It should be noted that there occurs an increase in the Fermi level $E_F$ with respect to the lower edge of the conduction band Ec in the semiconductor layers having such high impurity concentration levels, while the Fermi level $E_F$ itself is determined by the condition of thermal equilibrium. Thus, the lower edge of the conduction band as well as the lower edge of the valence band of the emitter layer 25 are urged in the downward direction as compared with the base layer 24. Further, the lower edge of the conduction band and the lower edge of the valence band of the base layer 24 are urged slightly in the upward direction, and there appears a steep inclination of the conduction band and the valence band in the graded layer 25a.

Figure 13:
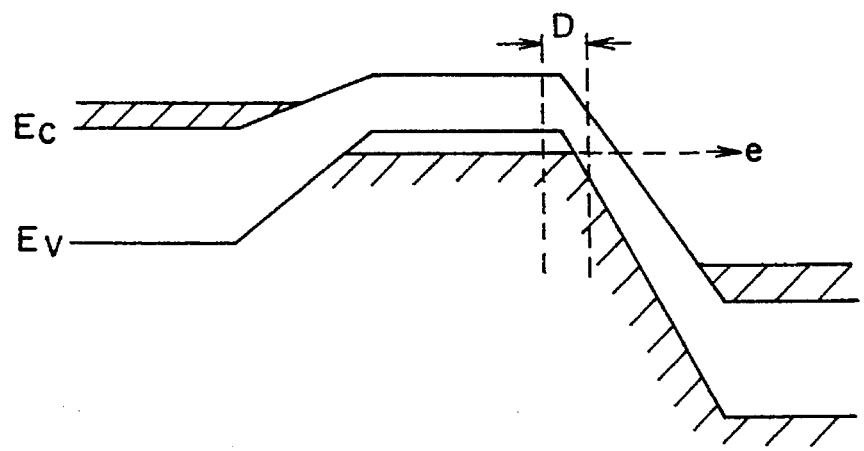
FIG. 13 is a band diagram showing the tunneling of electrons achieved as a result of the construction of FIG. 12.

FIG. 13 shows the band structure of the HBT of FIG. 12 in the state where a bias voltage is applied between the emitter electrode $26a_1$ and the emitter electrode $26a_2$. More specifically, FIG. 13 shows the state in which a negative voltage is applied to the foregoing first emitter electrode $26a_1$ and a positive voltage is applied to the second emitter electrode $26a_2$. Further, a large positive voltage is applied to the collector electrode 22a. See FIG. 8.

Under such a biasing condition, the region of the emitter layer 25 corresponding to the electrode $26a_1$ is applied with a forward biasing with respect to the base layer 24, and the electrons are injected to the base layer 24 efficiently from the electrode $26a_1$, after passing through the emitter contact layer $26_1$ and the layers 25a and 25b that form the emitter layer 25. On the other hand, the region of the emitter layer 25 corresponding to the electrode $26a_2$ is applied with a reverse biasing with respect to the base layer 24 and there is formed a depletion layer D in correspondence to the interface between the base layer 25 and the emitter layer 25, more particularly in correspondence to the interface between the graded layer 25a and the base layer 24. In the present invention, it should be noted that the base layer 24 and the emitter layer 25 are both doped to a high impurity concentration level. Thus, the depletion layer D thus formed has a small thickness, at best about 10 nm or less.

Generally, the thickness d of a depletion layer associated with a p-n junction is represented by an equation $$d = a \times \{(N_A+N_D)/N_A \cdot N_d\}^{1/2} \cdot (Vb_i - V)^{1/2}$$

where A represents a constant, $N_A$ represents the acceptor concentration level in the p-type layer, $N_D$ represents the donor concentration level in the n-type layer, $Vb_i$ represents the built-in potential of the p-n junction, and V represents the voltage applied to the p-n junction. It will be noted from the foregoing equation that the thickness d of the depletion layer D is small in the structure of FIG. 11 because of the very large concentration levels $N_A$ and $N_D$.

When an electric field is applied to the p-n junction having such a thin depletion layer D, there occurs a Zener breakdown as is well known in the art, and the electrons cause a tunneling through the depletion layer D and injected, from the base layer 24, to the region of the emitter layer corresponding to the electrode $26a_2$ and the emitter contact layer $26_2$. In other words, the electrons, created in the base layer 24 as a result of recombination of the electrons injected into the base layer 24 from the emitter electrode $26a_1$ and the emitter contact layer $2_1$, are immediately removed from the base layer 24 via the emitter contact layer $26_2$ and the emitter electrode $26a_2$, and the HBT operates stably.

Figure 14:
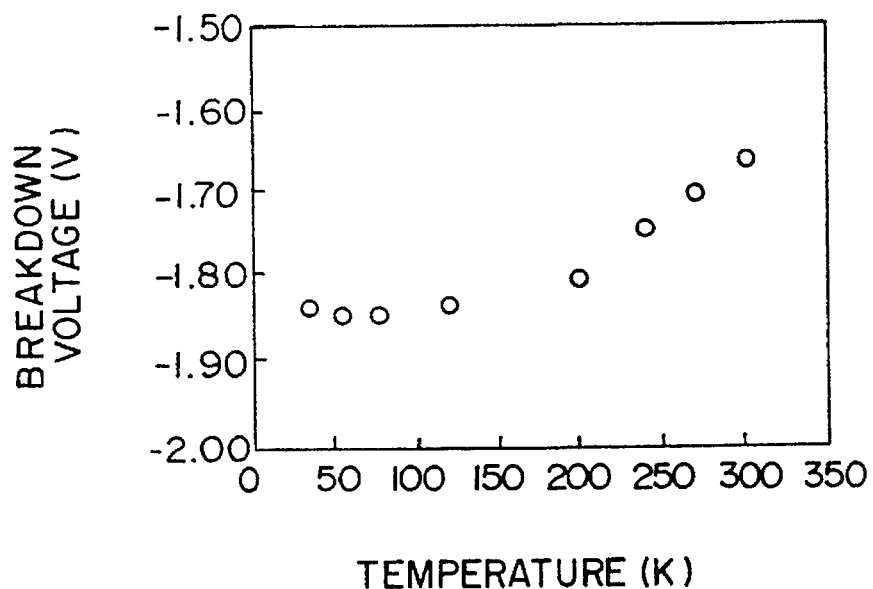
FIG. 14 is a diagram showing the relationship between the tunneling current observed in the HBT of FIG. 8 and the operational temperature of the device.

FIG. 14 shows the relationship between the observed breakdown voltage and the operational temperature for a HBT having a structure of FIG. 11, wherein InGaAs doped to the impurity concentration level of $5 \times 10^{19}$ cm$^{-3}$ is used for the base layer 24, while AlInGaAs doped to the impurity concentration level of $2 \times 10^{18}$ cm$^{-3}$ is used for the emitter layer 25. In the experiment of FIG. 14, the voltage applied between the electrodes $26a_1$ and $26a_2$ for causing the breakdown of the p-n junction between the emitter layer 25 and the base layer 24, is measured for various operational temperatures. As will be seen clearly in FIG. 14, the breakdown voltage decreases with increasing temperature.

Figure 15:
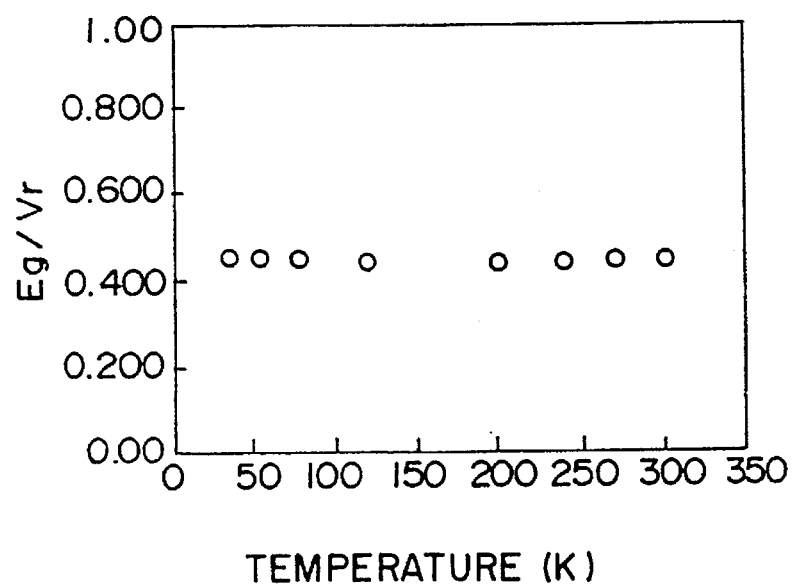
FIG. 15 is another diagram showing the tunneling current observed in the HBT of FIG. 8.

FIG. 15 shows a ratio of the bandgap Eg of GaAs that forms the base layer 24 with respect to the breakdown voltage Vr obtained in FIG. 14. As will be seen in FIG. 15, the ratio Eg/Vr is constant irrespective of the temperature and takes a value in the range between 0.4 and 0.5. Such a tendency is pertinent to the tunneling current. Thus, it is believed that the breakdown observed in the experiment of FIG. 14 is attributed to the Zener breakdown.

Generally, breakdown of p-n junction occurs either by way of avalanche breakdown or Zener breakdown. In the avalanche breakdown, the probability of scattering of electrons by optical phonons increases with temperature, and the drift velocity of the electrons decreases. As a result, it is necessary to increase the electric field in order to obtain the same kinetic energy of electrons. Thus, the avalanche breakdown tends to show a temperature dependence in which the breakdown voltage increases with increasing temperature.

In the Zener tunneling, in contrast, the probability of tunneling is represented by the equation $$P = A \cdot \exp[-4(2m^*)^{1/2} E_g^{3/2}/3ehF]$$

where m* stands for the effective mass of an electron, Eg stands for the bandgap and F stands for the electric field intensity. Thus, the tunneling probability P increases with decreasing bandgap Eg, while the bandgap Eg generally decreases with increasing temperature. Thus, the tunneling current increases with increasing temperature and the breakdown voltage decreases with increasing temperature. Summarizing the above, it has been confirmed, based upon the temperature dependence of the breakdown voltage, that the Zener tunneling is predominant in the breakdown of the HBT of FIG. 11.

In the structure of FIG. 11, one may remove the part of the emitter layer 25 extending between the emitter contact layer $26_1$ and $26_2$ when the emitter layer 25 has a large thickness.

Next, the HBT according to a second embodiment of the present invention will be described with reference to FIG. 16 wherein FIG. 16 shows the band structure of the HBT taken along a path of the electrons from the first emitter region that includes the emitter contact layer $26_1$ and corresponding emitter layer 25, to the collector layer 23. In FIG. 16, the conduction band is designated as Ec and the valence band is designated as Ev, similarly as before.

In the present embodiment, the base layer 24 forms an electric field acting from a first surface contacting to the emitter layer 25, to a second, opposite surface contacting to the collector layer 23, for efficient injection of the electrons from the base layer 24 to the collector layer 23. For this purpose, the base layer 24 of the present invention is formed of AlGaAs having a composition represented as $Al_xGa_{1-x}As$, with a graded compositional profile such that the compositional parameter x changes generally linearly from the foregoing first surface to the second surface. Preferably, the compositional parameter x is set to 0.3 at the first surface and to 0.0 at the second surface of the base layer 24.

In such a structure, the electrons injected to the base layer 24 cause a drifting preferentially to the collector layer 23 along the sloped conduction band Ec of the base layer 24. Thereby, the proportion of the electrons of the base layer 24 that reach the second emitter region, which includes the second emitter contact layer $26_2$, decreases substantially. Thus, the second emitter region acts predominantly to remove the electrons that are newly created in the base layer 24 as a result of recombination of the electrons injected to the base layer 24 and the holes already existing in the p-type layer 24. In the HBT having such a structure, it should be noted that the current corresponding to the base current of conventional HBT shown in FIG. 6 decreases substantially, and a very large current gain is attained. The construction of the present embodiment is particularly advantageous in the integrated circuits having a high integration density where the separation between the first contact layer $26_1$ and the second contact layer $26_2$ is less than 0.1 µm.

Figures 1, 17A:
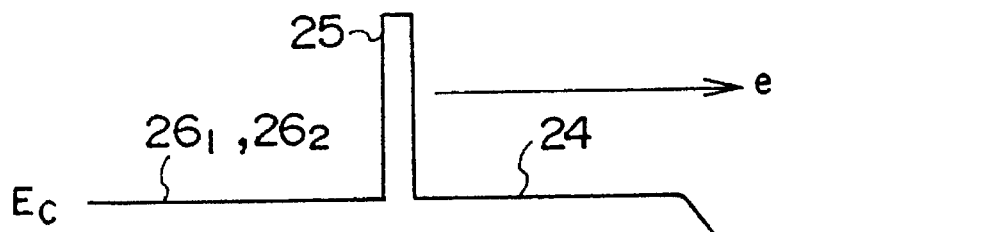
FIGS. 17A and 17B are band diagrams showing the construction of t HBT according to a third embodiment of the present invention.
Figures 2, 17A:
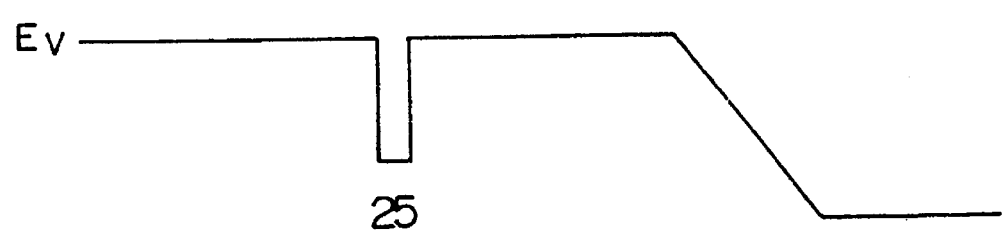
Figures 1, 17B:
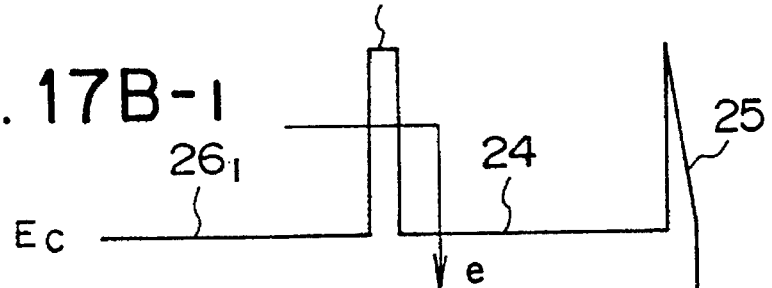
Figures 2, 17B:
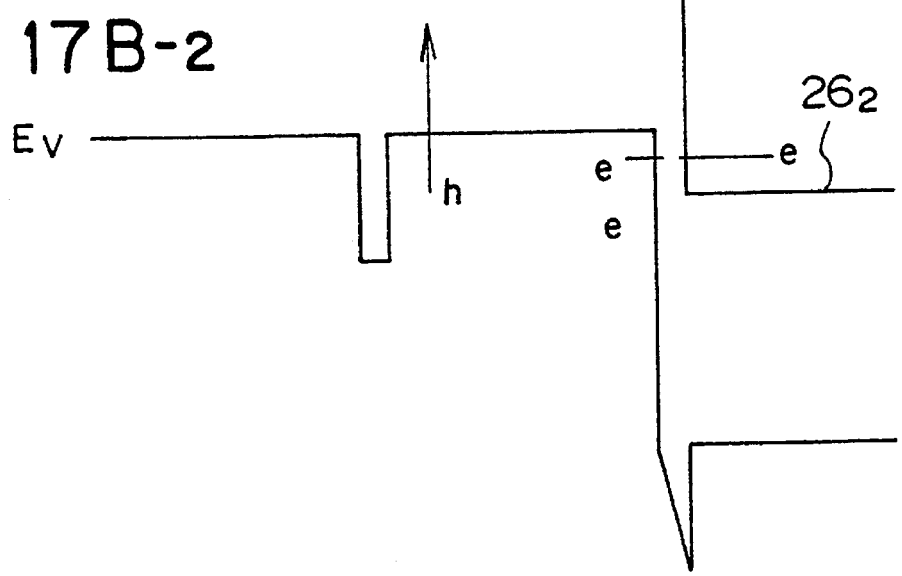

FIGS. 17A and 17B show the band structure of the HBT according to a third embodiment of the present invention, wherein the HBT of the present embodiment sets the thickness of the emitter layer 25, formed of n-type AlGaAs as set forth with reference to FIG. 11, to be no larger than 10 nm such that the electrons can transit through the emitter layer 25 by tunneling. Associated therewith, the emitter layer 25 includes no graded layer.

Other aspects of the HBT of the present embodiment are substantially the same as the HBT of FIG. 11. Thus, the emitter contact layer 261 of n-type GaAs is formed on the thin emitter layer 25 in correspondence to the foregoing first emitter region, and the first emitter electrode $26a_1$ is formed on the emitter contact layer $26_1$ thus formed. Similarly, the second emitter contact layer $26_2$ is formed on the emitter layer 25 in correspondence to the second emitter region, and the second emitter electrode $26a_2$ is formed on the emitter contact layer $26_2$. It should be noted that FIG. 17A shows the band structure along a path of the electrons from the emitter contact layer $26_1$ or $26_2$ to the collector layer 23 via the emitter layer 25 and the base layer 24, while FIG 17B shows the band structure along the path of the electrons from the first emitter contact layer $26_1$ to the second emitter contact layer $26_2$, via the emitter layer 25, the base layer 24 and the emitter layer 25.

Referring to FIG. 17A, those electrons that have high energies on the conduction band of the emitter contact layer $26_1$ transit through the potential barrier associated with the emitter layer 25 selectively by tunneling and are injected to the base layer 24 in the form of hot electrons. As the hot electrons, having high energies, pass through the depletion layer formed at the interface between the base layer 24 and the collector layer 23 and reach the collector layer 23 with high efficiency. On the other hand, the electrons that have lost energy in the base layer 24 due to scattering are annihilated in the base layer 24 as a result of recombination with holes, and electrons are newly created in the base layer 24 as a result of consumption of the holes. Such electrons pass through the potential barrier formed by the emitter layer 25 and reach the second emitter contact layer $26_2$, where the electrons are absorbed by the second electrode $26a_2$.

In the present embodiment, the electrons are injected from the first emitter contact layer $26_1$ to the base layer 24 in the form of hot electrons having a high energy. Thus, the probability that the injected electrons do not travel straight to the collector layer but travel sideways and reach the second emitter contact layer $26_2$ is substantially reduced. As a result, the HBT of the present embodiment suppresses the increase of base current and a large current gain is attained. Similarly to the second embodiment, the HBT of the present embodiment is also effective for constructing integrated circuits having a high integration density where the separation between the first and second emitter contact layers $26_1$ and $26_2$ is less than 0.1 µm.

Figure 18:
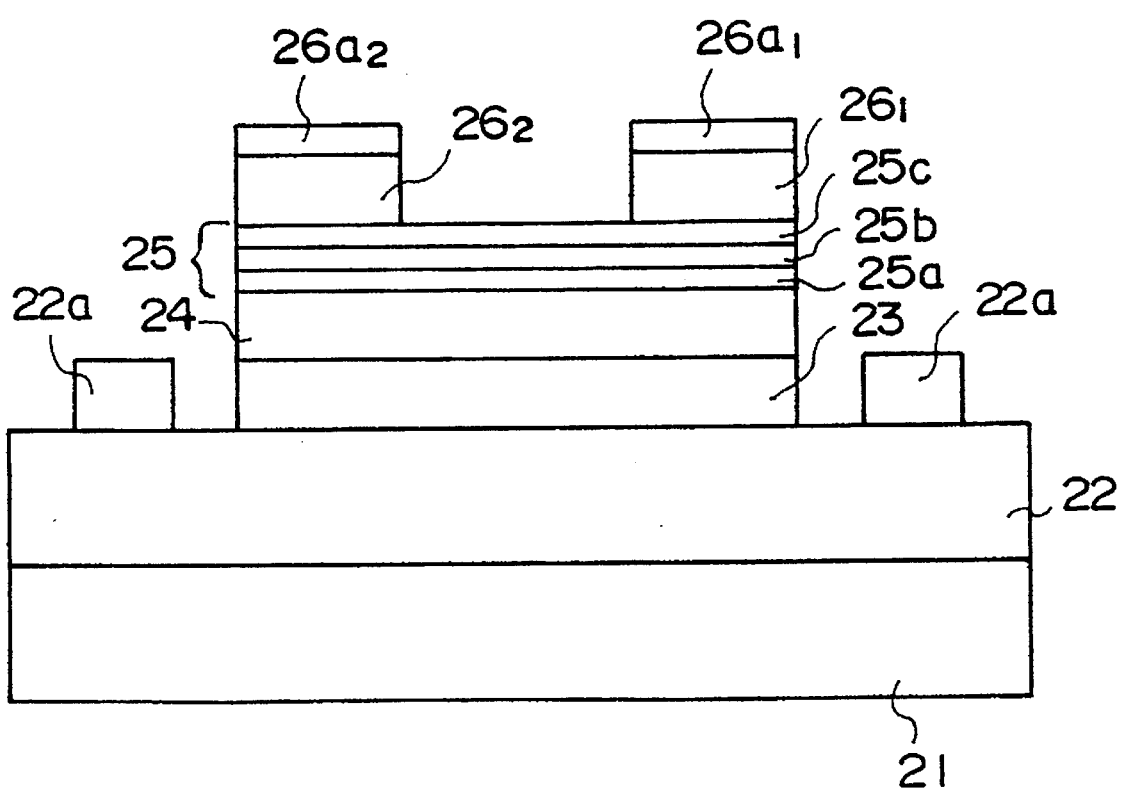
FIG. 18 is a cross sectional diagram showing the construction of the HBT according to a fourth embodiment the present invention.

FIG. 18 shows the construction of the HBT according to a fourth embodiment of the present invention. In FIG. 18, those parts corresponding to the parts described previously are designated by the same reference numerals and the description thereof will be omitted.

Referring to FIG. 18, the emitter layer 25 is formed of three undoped layers 25a, 25b and 25c that are stacked each other, wherein the uppermost layer 25a and the lowermost layer 25b are formed of AlGaAs having a large bandgap, while the intermediate layer 25b is formed of GaAs having a smaller bandgap. Further, the layers 25aa–25c have respective thicknesses set such that the electrons can pass therethrough freely by tunneling. Particularly, the intermediate layer 25b has a thickness of no larger than about 10 nm, preferably no larger than 3 nm.

Figures 20A, 20B:
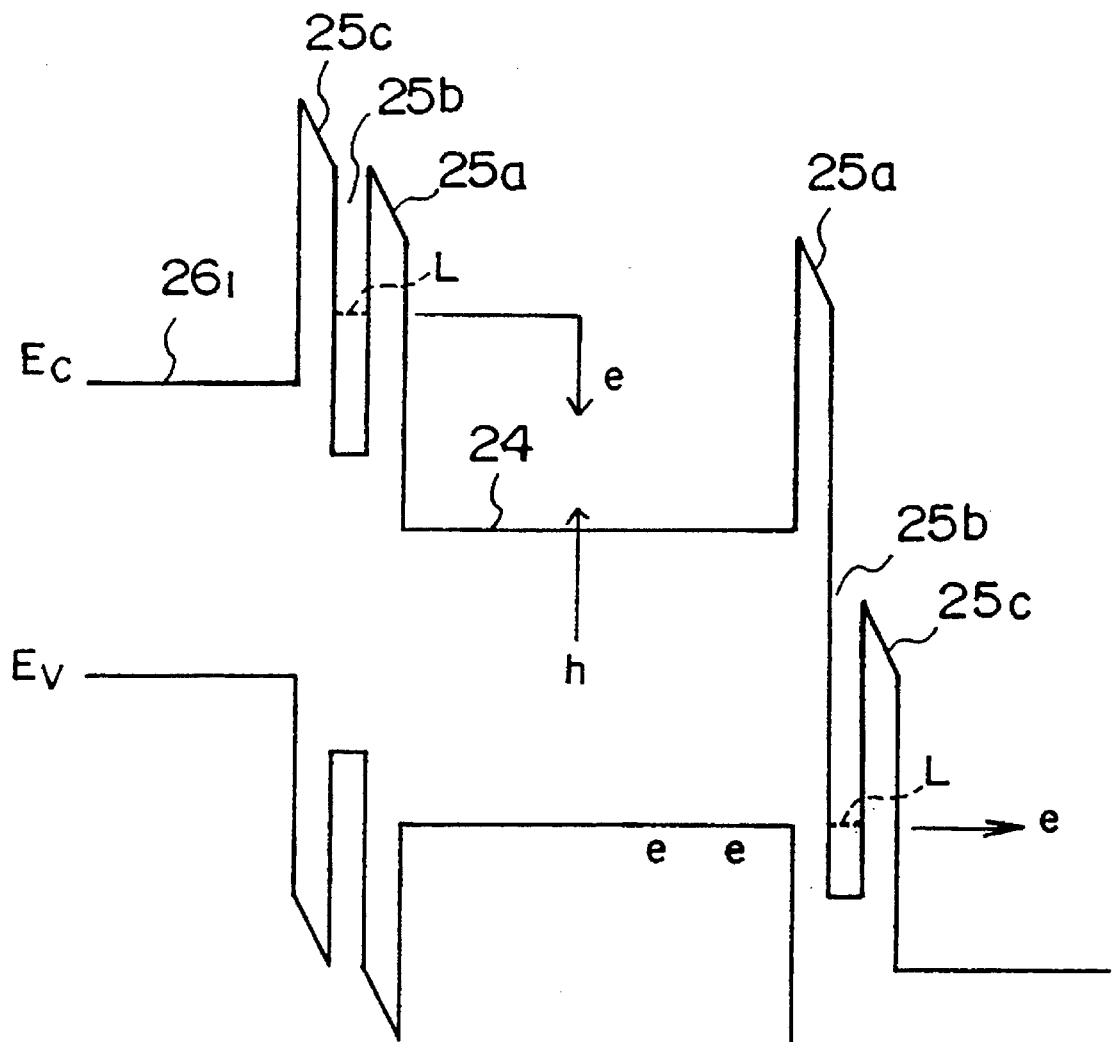
FIG. 20 is another band diagram for explaining the operation of the HBT of FIG. 18.

In such a structure, the emitter layer 25 forms a resonant-tunneling barrier in correspondence to the quantum levels formed in the layer 25b, and the electrons passed through the resonant-tunneling barrier are injected to the base layer 24 as hot electrons as indicated in FIG. 19. The hot electrons thus injected to the base layer 24 transit through the base layer 24 and are further injected to the collector layer 23 efficiently, and the probability for returning to the second emitter contact layer $26_2$ is substantially reduced. On the other hand, the electrons created in the base layer 24 as a result of recombination of the injected electrons and the holes in the base layer 24, escape to the second emitter contact layer $26_2$ through the resonant-tunneling barrier formed by the emitter layer 25 as indicated in the band diagram of FIG. 20. As a result, accumulation of electrons in the base layer 24 is successfully eliminated and the HBT operates stably. Further, one may use a wide gap material having a bandgap larger than that of the base layer 24 formed of GaAs, for one or both of the emitter contact layers $26_1$ and $26_2$, for suppressing the injection of the holes to the emitter contact layer $26_1$ or $26_2$ from the base layer 24 via the emitter layer 25.

Figure 21:
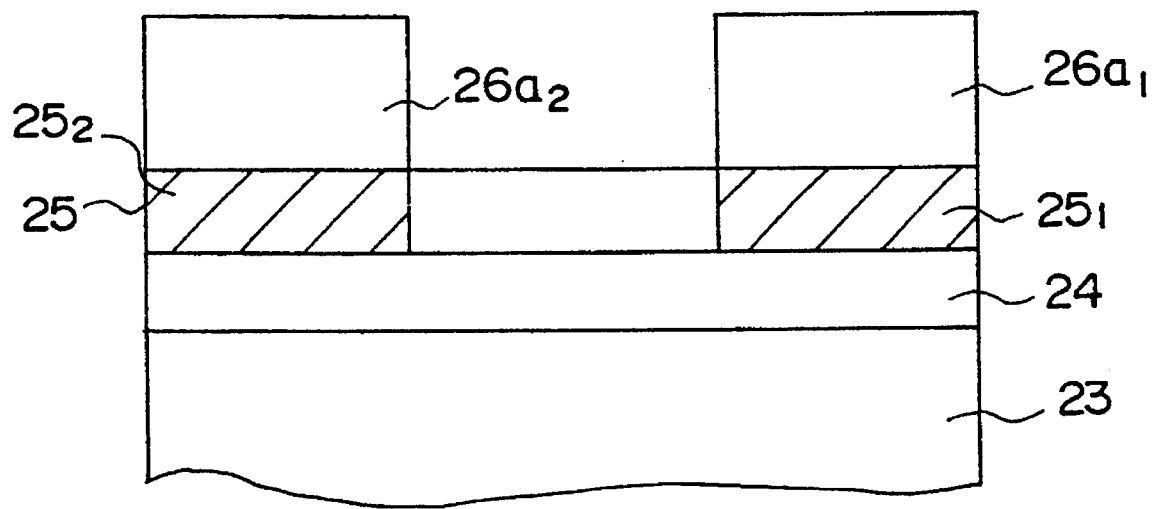
FIG. 21 is a cross sectional diagram showing an essential part of the HBT according to a fifth embodiment of the present invention in an enlarged scale.

FIG. 21 shows the construction of the HBT according to a fifth embodiment of the present invention. In FIG. 21, those parts described previously are designated by the same reference numerals and the description thereof will be omitted.

In the present embodiment, the emitter layer 25 is formed of lightly doped or non-doped AlGaAs, and the first emitter electrode $26a_1$ and the second emitter electrode $26a_2$ are formed directly on the emitter layer 25. More specifically, the electrodes $26a_1$ and $26a_2$ are formed by stacking a Pd layer having a thickness of about 40 nm and a Ge layer having a thickness of about 30 nm, followed by a heat treatment process conducted at 320° C. for one minute to cause a diffusion of Ge into the emitter layer 25. As a result of such a heat treatment, n-type diffusion regions $25_1$ and $25_2$ are formed in the emitter layer 25 with a thickness of 10 nm or less, in the form of an alloy layer. The HBT having such a structure provides an operation similarly to the previous embodiments.

In any of the HTBs of the previous embodiments, one can reduce the transit time of the electrons through the base layer 24 by setting the thickness of the base layer 24 to be equal to or smaller than the mean free path of electrons in the layer 24. As a result, the high speed operational characteristics of the transistor is improved substantially. As the HBT of the present invention does not use the base electrode provided directly on the base layer, the difficulty of fabrication of the device is successfully eliminated.

Figures 22A, 22B:
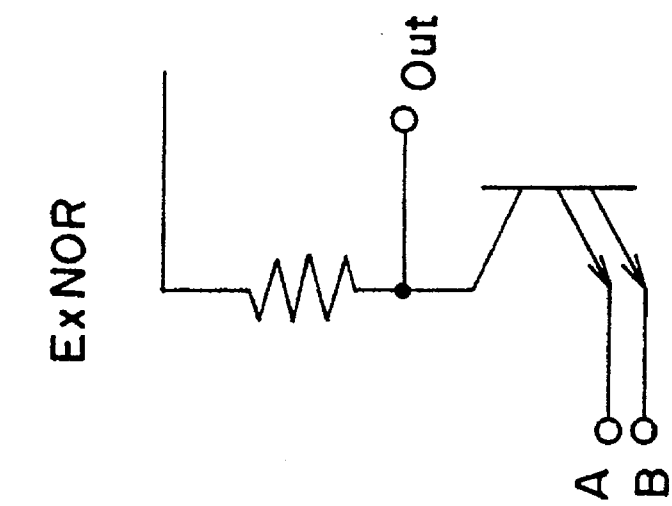
FIGS. 22A and 22B are diagrams showing the construction and tion of a logic circuit formed of the HBT of the present invention.

Next, an example of logic circuit realized by the HBT of the present invention will be described with reference to FIGS. 22A and 22B, wherein FIG. 22A shows an equivalent circuit diagram of the HBT of FIG. 11 while FIG. 22B shows the operation of the circuit of FIG. 22A.

Referring to FIGS. 22A and 22B, a first logic signal A is supplied to the first emitter electrode $26a_1$ of the HBT of FIG. 8 while a second logic signal B is supplied to the second emitter electrode $26a_2$. Thereby, the HBT produces an output signal indicative of the exclusive logic sum of the logic signals A and B at the collector electrode $22a$. As the first emitter region corresponding to the emitter electrode $26a_1$ and the second emitter region corresponding to the emitter electrode $26a_2$ are formed symmetrically to each other, the logic output obtained at the collector electrode $22a$ is also symmetric with respect to the logic signals A and B as indicated in FIG. 22B, and the transistor does not conduct when both of the signals A and B have a logic value "0." In this case, therefore, one obtains a logic output "1." On the other hand, when one of the logic signals A and B has the logic value "0" and the other hand the logic value "1," the state shown in FIG. 13 is realized and the HBT causes a conduction. Thereby, one obtains a logic output "0" at the collector of the HBT. Further, when both of the logic signals A and B have the logic value "1," the electrons injected from one of the emitters are collected by the other emitter without reaching the collector, and no conduction of the transistor occurs. Thus, the operation shown in FIG. 22B indicates the exclusive OR (XOR) operation.

In any of the foregoing embodiments, the present invention has been described for an HBT having two emitters. However, the present invention is by no means limited to such a specific construction but is applicable to the HBT having three or more emitters as well. As the construction of such a multiple emitter HBT is obvious from the description heretofore, further description thereof will be omitted.

Further, the present invention is by no means limited to the HBTs described heretofore which have the collector and base layers formed of GaAs and the emitter layer formed of AlGaAs, but is applicable also to other HBTs that use different materials for the emitter, base and collector. For example, one may use InGaAs for the collector layer and the base layer and AlInGaAs for the emitter layer or emitter contact layer. Furthermore, the multiple emitter construction of the present invention is by no means limited to the HBTs using compound semiconductor materials but is also applicable to the HBTs that use the Si/Ge heterojunction interface.

Further, the present invention is by no means limited to the embodiments described heretofore, but various variations and modifications may be made without departing from the scope of the invention.

What is claimed is:

1. A bipolar transistor comprising:

a collector layer of a semiconductor material having a first conductivity type;

a collector electrode connected to said collector layer for collecting carriers from said collector layer;

a base layer of a semiconductor material having a second, opposite conductivity type and provided on said collector layer, said base layer not connected to said collector electrode;

an emitter layer of a semiconductor material provided on said base layer, said emitter layer having a first region and a second region, said first region being spaced from said second region;

a first emitter structure provided on said first region of said emitter layer, said first emitter structure including a first emitter electrode such that said first emitter electrode is connected to said first region of said emitter layer;

a second emitter structure provided on said second region of said emitter layer, said second emitter structure including a second emitter electrode such that said second emitter electrode is connected to said second region of said emitter layer;

said second region of the emitter layer and said base layer being doped to respective impurity concentration levels set such that carriers in said base layer escape to said second region of said emitter layer by way of tunneling through a depletion region formed between said base layer and said second region of the emitter layer, wherein said second emitter region is doped to a concentration level such that a carrier density exceeding an effective state density is realized therein, and wherein said base layer is doped to a concentration level such that a carrier density equal to or exceeding an effective state density is realized in said base layer.

2. A bipolar transistor as claimed in claim 1, wherein said second emitter and said base layer are doped with respective impurity concentration levels set such that said depletion region has a thickness of 10 nm or less.

3. A bipolar transistor as claimed in claim 1, wherein said first emitter includes an emitter layer covering the entire of an upper major surface of said base layer and a first emitter contact layer formed on said emitter layer in correspondence to a first region of said base layer, and wherein said second emitter layer includes said emitter layer and a second emitter contact layer formed on said emitter layer in correspondence to a second region of said base layer.

4. A bipolar transistor as claimed in claim 1, wherein said semiconductor material forming said emitter layer is doped to said first conductivity type and has a bandgap substantially exceeding a bandgap of said semiconductor material forming said base layer.

5. A bipolar transistor as claimed in claim 1, wherein said emitter layer has a thickness that allows a tunneling of electrons therethrough.

6. A bipolar transistor as claimed in claim 1, wherein said semiconductor layer forming said emitter layer is undoped and has a bandgap exceeding a bandgap of said semiconductor material that forms said base layer, said emitter layer having a thickness set so as to allow a tunneling of electrons therethrough.

7. A bipolar transistor as claimed in claim 6, wherein said emitter layer includes first and second barrier layers forming a resonant-tunneling barrier and a quantum well layer sandwiched between said first and second barrier layers, said quantum well layer including therein quantum levels.

8. A bipolar transistor as claimed in claim 1, wherein said base layer has a compositional gradient and a corresponding gradient in a conduction band and a valence band, such that a potential of said conduction band and said valence band decreases gradually from a first surface of said base layer where said base layer contacts with said emitter layer to a second surface of said base layer where said base layer contacts with said collector layer.

9. A bipolar transistor as claimed in claim 8, wherein said base layer has a thickness generally equal to a mean free path of carriers in said base layer.

10. A bipolar transistor as claimed in claim 1, wherein said first emitter structure includes a first emitter contact layer provided on said first region of said emitter layer and carrying thereon said first emitter electrode, said second emitter structure includes a second emitter contact layer provided on said second region of said emitter layer, said second emitter contact layer carrying thereon said second emitter electrode.

11. A bipolar transistor, comprising, a collector layer of a semiconductor material having a first conductivity type;

a collector electrode connected to said collector layer for collecting carriers from said collector layer;

a base layer of a semiconductor material having a second conductivity type and provided on said collector layer, said base layer not connected to said collector electrode;

an emitter layer provided on said base layer, said emitter layer having a plurality of emitter regions spaced from each other; and a plurality of emitter electrodes provided in correspondence to said plurality of emitter regions;

wherein each of said emitter regions and said base layer are doped to respective impurity concentration levels set such that carriers in said base layer can escape to said plurality of emitter regions by way of tunneling through a depletion layer formed between said base layer and each of said emitter regions.

12. A logic circuit, comprising:

a bipolar transistor comprising:

a collector layer of a semiconductor material having a first conductivity type;

a collector electrode connected to said collector layer for collecting carriers from said collector layer;

a base layer of a semiconductor material having a second conductivity type and provided on said collector layer, said base layer not connected to said collector electrode;

an emitter layer provided on said base layer, said base layer having a plurality of emitter regions spaced from each other; and a plurality of emitter electrodes connected to said plurality of emitter regions respectively;

wherein each of said emitter regions and said base layer are doped to respective impurity concentration levels set such that carriers in said base layer can escape to said plurality of emitter regions by way of tunneling through a depletion layer formed between said base layer and each of said emitter regions;

a power terminal connected electrically to said collector electrode;

an output terminal connected electrically to said collector electrode; and a plurality of input terminals each connected electrically to corresponding ones of said plurality of emitter electrodes.

* * * * *